United States Patent [19]

Breimesser

[11] 3,997,798
[45] Dec. 14, 1976

[54] CIRCUIT ARRANGEMENT FOR GATING OUT PULSES AND/OR PULSE GAPS WHOSE DURATION IS SHORTER THAN A GIVEN TEST PERIOD $T_p$ FROM A SEQUENCE OF DIGITAL PULSES PRESENT AT THE INPUT END

[75] Inventor: Fritz Breimesser, Deisenhofen, Germany

[73] Assignee: Siemens Aktiengesellschaft, Berlin & Munich, Germany

[22] Filed: Mar. 28, 1975

[21] Appl. No.: 563,230

[30] Foreign Application Priority Data

Mar. 29, 1974 Germany ............... 2415365

[52] U.S. Cl. .................. 307/234; 328/111; 328/119; 328/130; 329/106
[51] Int. Cl.² .......................... H03K 5/13
[58] Field of Search ......... 307/234, 232; 328/111, 328/112, 119, 109, 48; 329/106

[56] References Cited
UNITED STATES PATENTS

| | | | |
|---|---|---|---|
| 3,646,371 | 2/1972 | Flad | 328/48 |
| 3,667,054 | 5/1972 | Nelson | 328/119 |
| 3,753,135 | 8/1973 | Kastner et al. | 329/106 |

Primary Examiner—John Zazworsky
Assistant Examiner—Marcus S. Rasco
Attorney, Agent, or Firm—Hill, Gross, Simpson, Van Santen, Steadman, Chiara & Simpson

[57] ABSTRACT

A novel circuit arrangement is provided for gating out pulses and/or pulse gaps whose duration is shorter than a given test period $t_p$ from a sequence of digital pulses present at the input end. The arrangement is such that the test period can be set with arbitrary accuracy and yet at the same time can be arbitrarily varied. It is insensitive to temperature fluctuations within wide limits.

A principal feature of the present invention is to provide a circuit arrangement in which at least one counter is provided which may be set and which exhibits a setting input for the setting of a fixed or variable initial value in the counter, and in which the test period $t_p$ may be determined as a counter period from the initial value after a give value in the counter.

If only pulses are to be gated out, such a circuit arrangement is advantageously constructed in such a manner that at least one gate is provided which has at least two inputs, and at least one decoder is provided having at least first inputs for the parallel input of at least one digital word and having one output, and at least one binary storage element (flip-flop circuit) is provided having at least two inputs, where the output of the gate is connected to the counter input of the counter, the counter outputs for the parallel withdrawal of the count are connected to the first inputs of the decoder and the output of the decoder is connected to a first input of the binary storage element, and where a first input of the gate is connected to the setting input of the counter and to a second input of the binary storage element.

If only pulse gaps are to be gated out, advantageously in this circuit arrangement the gate is preceded by an inverter whose output is connected to the first input of the gate.

11 Claims, 4 Drawing Figures

CIRCUIT ARRANGEMENT FOR GATING OUT PULSES AND/OR PULSE GAPS WHOSE DURATION IS SHORTER THAN A GIVEN TEST PERIOD $T_p$ FROM A SEQUENCE OF DIGITAL PULSES PRESENT AT THE INPUT END

BACKGROUND OF THE INVENTION

The present invention relates to a circuit arrangement for gating out pulses and/or pulse gaps whose duration is shorter than a given test period $t_p$ from a sequence of digital pulses present at the input end.

Circuit arrangements of the type described in the introduction are known. These circuit arrangements operate basically in analogue fashion with monostable multivibrators or integrators. In circuit arrangements having monostable multivibrators the test period $t_p$ is governed by the latter' triggering period $\tau$, whereas in circuits featuring integrators the test period $t_p$ is determined by the rise time to a given trigger-threshold voltage $U_0$. In both cases the test period $t_p$ is determined by the time constant of the RC elements. If no special circuitry provisions are made, monostable multivibrators and integrators generally require a recovery time within which they are not available for re-use and which is also basically determined in terms of length by the time constant of the RC elements. On account of the resistance and capacitance tolerances always present in the RC elements, the circuit arrangements have the disadvantage that the test period cannot be prescribed with arbitrary accuracy. Also on account of the relatively long recovery time, uncontrollable adulterations of pulse lengths can occur which act as interferences in the output signal. A further disadvantage of these circuit arrangements is that the test period can only be varied by changes in the RC elements. Circuit arrangements having variable test periods are therefore not suitable for full integration, whereas in the case of circuits having a fixed test period the latter cannot be accurately determined. In addition, the test period is limited by the magnitude of the capacitance which can be technologically established on an integrated circuit. Another disadvantage in these circuit arrangements results from the temperature dependence of the RC elements and the threshold voltages.

SUMMARY OF THE INVENTION

The aim of the present invention is to provide a circuit arrangement of the type mentioned in the introduction in which the test period can be set with arbitrary accuracy and at the same time can be arbitrarily varied and which is insensitive to temperature fluctuations in wide limits.

The aim is realized in accordance with the invention with a circuit arrangement in which at least one counter is provided which may be set and which exhibits a setting input for the setting of a fixed or variable initial value in the counter, and in which the test period $t_p$ may be determined as a counter period from the initial value after a given value in the counter.

If only pulses are to be gated out, such a circuit arrangement is advantageously constructed in such a manner that at least one gate is provided which has at least two inputs, and at least one decoder is provided having at least first inputs for the parallel input of at least one digital word and having one output, and at least one binary storage element (flip-flop circuit) is provided having at least two inputs, where the output of the gate is connected to the counter input of the counter, the counter outputs for the parallel withdrawal of the count are connected to the first inputs of the decoder and the output of the decoder is connected to a first input of the binary storage element, and where a first input of the gate is connected to the setting input of the counter and to a second input of the binary storage element.

If only pulse gaps are to be gated out, advantageously in this circuit arrangement the gate is preceded by an inverter whose output is connected to the first input of the gate.

Preferably in the event that both pulses and pulse gaps are to be gated out, the circuit arrangement is extended in such a manner that between the first input of the gate and the second input of the binary storage element there is connected an inverter and a second circuit arrangement consisting of at least one gate having at least two inputs, one counter which may be set and which has a setting input for setting a fixed or variable initial value and a decoder having at least first inputs for the parallel input of at least one digital word and with one output, where the output of the gate is connected to the counter input of the counter, the outputs of the counter for the parallel withdrawal of the count are connected to the first inputs of the decoder and a first input of the gate is connected to the setting input of the counter, and wherein the first input of the gate is connected via the inverter to the first input of the gate of the second circuit arrangement and the output of the decoder of the second circuit arrangement is connected to the second input of the binary storage element.

Preferably, such a circuit arrangement is employed in digital systems, in particular in digital systems for the control of internal combustion engines.

The advantages of the circuit of the invention in comparison to known realizations of the prior art are as follows: The test period may be freely programmed and can be varied within wide limits. The test period is an exact multiple of the pulse train length $t_t$ of the counter pulse trains and can basically be set with arbitrary accuracy, the accuracy limit being determined by the finite switching time of the components employed and the number of positions of the counter which is used. All the output signals are synchronized with $t_t$ and the recovery time following a test process corresponds to the switching time of the components which are used. The circuit arrangement is suitable for full integration. In addition, the circuit arrangement is independent of temperature within wide limits on account of the digital mode of operation.

BRIEF DESCRIPTION OF THE DRAWINGS

Preferred embodiments of the present invention are illustrated in the drawings, as follows.

DESCRIPTION OF PREFERRED EMBODIMENTS

Figure 1:
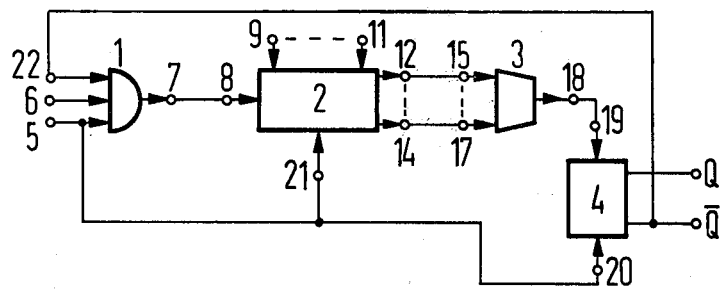
FIG. 1 schematically illustrates a preferred circuit construction in which only pulses are gated out.

In FIG. 1, the output 7 of the gate 1 is connected to the counter input 8 of the counter 2, and the parallel outputs 12 to 14 for the withdrawal of the count are connected to the inputs 15 to 17 of the decoder 3. The output 18 of the decoder is connected to a first input 19 of the binary storage circuit 4. The first input 5 of the gate is connected to the setting input 21 of the counter and to a second input 20 of the binary storage element.

Figure 2:
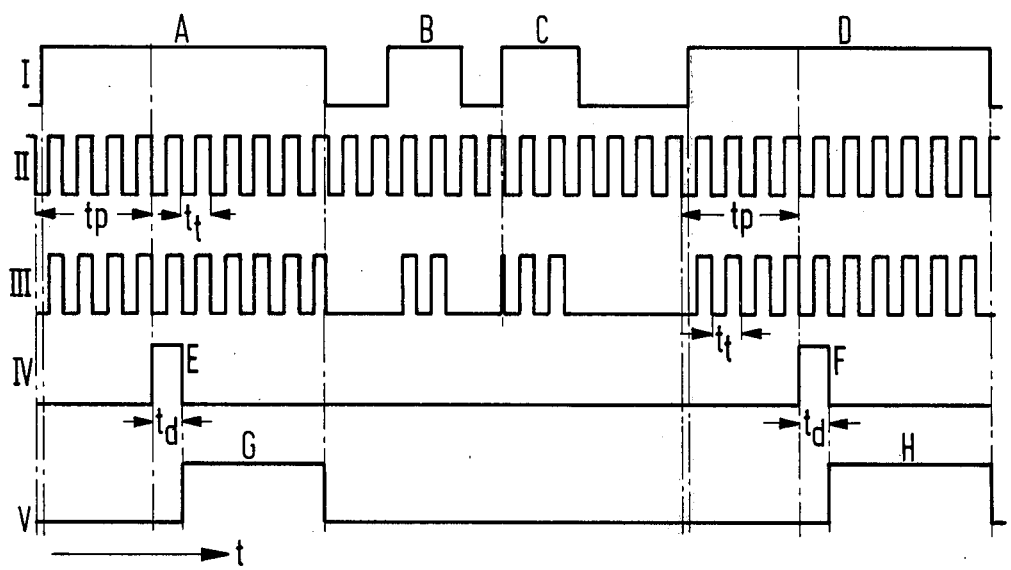
FIG. 2 illustrates a series of pulses over the time t which occur in the circuit arrangement shown in FIG. 1.

The mode of operation of the circuit arrangement shown in FIG. 1 will be explained making reference to FIG. 2. In FIG. 2 plotted over the time t are pulse series which occur at the individual circuit points of FIG. 1. The digital pulse sequence I is fed to the first input 5 of the gate 1. This sequence I represents a random selected example of all possible sequences of digital pulses which can at the input end be fed to the circuit arrangement. The individual pulses A to D of this pulse sequence will in the following be referred to as input pulses. A counter pulse sequence II is connected to the second input 6 of the gate. The pulse train length of the counter pulses will be assumed to be $t_t$. The gate 1 in the circuit arrangement of FIG. 1 should be selected to be such that it is only open for the counter pulses when and for as long as an input pulse is present at the input 5. Thus, an AND gate or a NAND gate will suffice as a gate. If then an input pulse appears at the input 5 of the gate, the gate is opened for the counter pulses. Then the pulse sequence III composed of individual groups of counter pulses appears at the output 7 of the gate. Here the gate has been based on an AND gate. In a NAND gate, the pulse sequence would merely have to be inverted, which would be of no significance for the counting process in the counter. These counter pulses pass to the counter input 8 of the counter 2 and the latter commences to count from a given initial value $m$ with the first pulse of each pulse group, and continues to count for the maximum until the pulse at the input 5 is at an end and a pulse gap appears as then the gate is blocked until the next pulse. At the same time, the counter is reset to the initial value via the setting input. The setting input can act dynamically or statically. It is only necessary that the setting should be effected by the rear edge of the input pulse or by the signal value of a pulse gap. The decoder 3 established the individual states of the counter and when a predetermined value n is reached in the counter, it emits a pulse at the output 18. The values $m$ and $n$, and the pulse train length $t_t$ of the counter pulses determine the test period $t_p$ in accordance with $t_p = (m - n) \cdot t_t$. The pulses E and F of the pulse sequence IV represent the pulses from the output of the decoder. In FIG. 2, $t_p = 4 \cdot t_t$ was selected by way of example. It was also assumed that the triggering edge of the counter pulses is the rear edge. As can also be seen from FIG. 2, pulses only appear at the output 18 of the decoder if the input pulse is longer than the test period $t_p$. In the example, this applied to the pulses A and D of the pulse sequence I. The pulse width $t_d$ of the pulses in the pulse sequence IV is dependent upon the decoder. As a rule, it is equal to the pulse train length $t_t$ of the counter pulses.

The pulse from the output 18 of the decoder sets the output Q of the binary storage element via the input 19 to 1. This state continues until the storage element is reset via the input 20. This resetting is effected by the rear edge of the input pulse or by the signal value O of the following pulse gap, thus simultaneously to the setting of the counter. Thus, the output pulse sequence V with the pulses G and H arises at the output Q of the storage element. As will be seen from this sequence, pulses occur only if the input pulse is longer than the test period $t_p$. The front edges of the pulses G and H are displaced by the time $t_p + t_d$ and shortened in comparison to the input pulses A and D in the sequence I. The displacement and shortening by the time $t_d$ in the example is due to the fact that the input 19 of the storage element was assumed to be active for the rear edge. It may be avoided if the input 19 acts statically or is active for the front edge. Irrespective of this, however, the displacement and shortening of the front edge in relation to that of the input pulse exhibits an inaccuracy of a maximum of one pulse train length $t_t$ which occurs due to the position of the front edge of the input pulse in relation to the triggering edge of the first counter pulse. This inaccuracy will reduce in accordance with how small $t_t$ is selected to be in comparison to $t_p$. The rear edge of the pulses G and H, on the other hand, coincides in time with the rear edge of the input pulses.

The counter for the circuit arrangement in FIG. 1 can be in the form of any counter which can be set, for example, up and down counters or reversible counters. It is, however, favorable to use counters which can be preset and exhibit presetting inputs as then variable initial values can be set. This results in the aforementioned advantage that the test period can then be freely programmed. In FIG. 1, presetting inputs of this kind are indicated by the inputs 9 to 11. Preferably, dual counters will be used on account of their simple construction. Down counters are also of advantage as then the value 0 can be selected as predetermined value $n$ in the counter. Then one has simply $t_p = m \cdot t_t$.

Comparators and coincidence circuits are suitable to be used as decoder. Counters having a zero transition switching mechanism are particularly favorable as this zero transition switching mechanism can be used as decoder. Conventional down counters which can be set may be used, for example, which, at a zero transition, emit a negative carry in the form of a pulse at an output provided for the purpose. With the zero transition a switching mechanism would check the carry from the count 0 to a maximum value. The Ser. No. 74,193 would form a suitable counter of this kind. The construction of this counter is represented on page 270 in "designing with TTL Integrated Circuits," McGraw-Hill Book Company, "Texas Instruments Electronics Series."

The selection of the binary storage circuits will be discussed in the following.

The circuit arrangement represented in FIG. 1 serves to gate out pulses. If pulse gaps are to be gated out it is also possible to use this circuit arrangement if the input signal is inverted. For this purpose it is sufficient to precede the gate 1 by an inverter whose output is connected to the first input 5.

In the circuit arrangement illustrated in FIG. 1, the counter counts the counter pulses until the input pulse is at an end. This can have a disadvantageous effect in the case of excessively long input pulses as for one input pulse several pulses can occur at the output of the decoder. The pulses at the output of the decoder can also be used as an output signal, however. In order thus to safely avoid several pulses occurring at the output of the decoder for one input pulse, it is necessary to stop the counting process at the right time. This is achieved most simply in that the gate 1 has a third input 22 which is connected to the output $\overline{Q}$ of the storage element 4. In FIG. 1, this input and output and their connection are shown. If the output Q of the storage element jumps to 1, $\overline{Q}$ carries O and the gate is blocked for the counter pulse trains via the input 22. The counting process is thus ended. When $\overline{Q}$ jumps back to 1, at the same time the gate is blocked via the input 5 so that a new counting process does not commence until the next input pulse appears.

A suitable binary storage element would, for example, be a pulsed JK flip-flop having a resetting input, where the output 18 of the decoder is connected to the pulse train input which forms the input 19 and the first input 5 of the gate is connected to the resetting input which forms the input 20. During the operation of the circuit the J-input must carry 1, and the K input must carry O. The resetting input generally operates statically in these flip-flops. If the decoder is in the form of a zero transition switching mechanism having an output for the emission of the negative carry, the latter's output signal must be inverted, i.e., an inverter must be connected between the output 18 of the decoder and the pulse train input of the JK flip-flop. The mode of operation of a JK flip-flop may be gathered from the generally know definition of the switching function of this flip-flop. A table for the switching function is given, for example, in "Binaere Schaltkreise" by Walter Wolfgarten, Dr. Alfred Huettig-Verlag GmbH, Heidelberg, page 78. In accordance with this definition of the switching function, the output Q is set at 1 or remains at L when a pulse (pulse E or F of the pulse series IV in FIG. 2) appears at the pulse train input of the flip-flop. It is only important that the resetting input should not influence the setting. This is generally the case.

Another possibility consists in providing the binary storage element in the form of a static RS flip-flop. The output 18 of the decoder is connected to the R input and the first input 5 of the gate 1 is connected to the S input. In this case a RS flip-flop is used which is constructed from NAND gates. A RS flip-flop of this kind is again represented in the book "Binaere Schaltkreise", quoted above, page 72, with the table for the switching function and has been taken as a basis here. In this circuit, it is merely necessary to invert the pulse series IV in FIG. 2. One other possibility would be to connect the output 18 of the decoder to the S-input and the first input 5 of the gate to the R-input. If the R-input reacts to 1 signals, an inverter must be connected prior to the R-input. The RS flip-flop is set by a setting pulse from the output 18 of the decoder and is reset by an input pulse gap.

The circuit arrangement illustrated in FIG. 1 has the advantage that the inverse signal is always available in addition to the output signal at the output Q of the binary storage element. Also a signal is available at the output of the decoder. The pulses of the output signal are shortened by the test period $t_p$ and possibly by the pulse width of the pulse at the output of the decoder. This shortening can easily be cancelled by addition or subtraction. The rear edge of the output pulse coincides with the rear edge of the input pulse.

Figure 3:
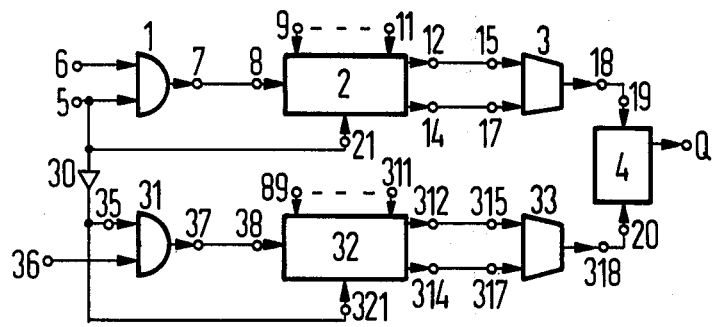
FIG. 3 schematically illustrates the preferred circuit construction in which pulses and pulse gaps are gated out.

FIG. 3 illustrates an extension of the circuit arrangement in accordance with the invention in which pulses and pulse gaps are gated out. Between the first input 5 of the gate 1 and the input 20 of the binary storage element 4 of the circuit arrangement are connected an inverter 30 and a second circuit arrangement. The second circuit arrangement consists of the gate 31 with the input 35 and 36, and with the output 37, of the counter 32 which may be set and which has the counter input 38, the setting input 321 and the outputs 312 and 314 for the count, and of the decoder 33 with the inputs 315 to 317 and with the output 318. The output 37 of the gate 31 leads to the counter input 38 and a first input 35 of the gate 31 is connected to the setting input 321 of the counter 32. The counter outputs 312 to 314 are connected to the inputs 315 to 317 of the decoder 33. The input 5 of the gate 1 is connected via the inverter 30 to the input 35 of the gate 31 of the second circuit arrangement. The output 318 of the decoder 33 of the second circuit arrangement is connected to the input 20 of the binary storage element. As can be seen from FIG. 3, the second circuit arrangement is of similar construction to the circuit arrangement of FIG. 1.

Figure 4:
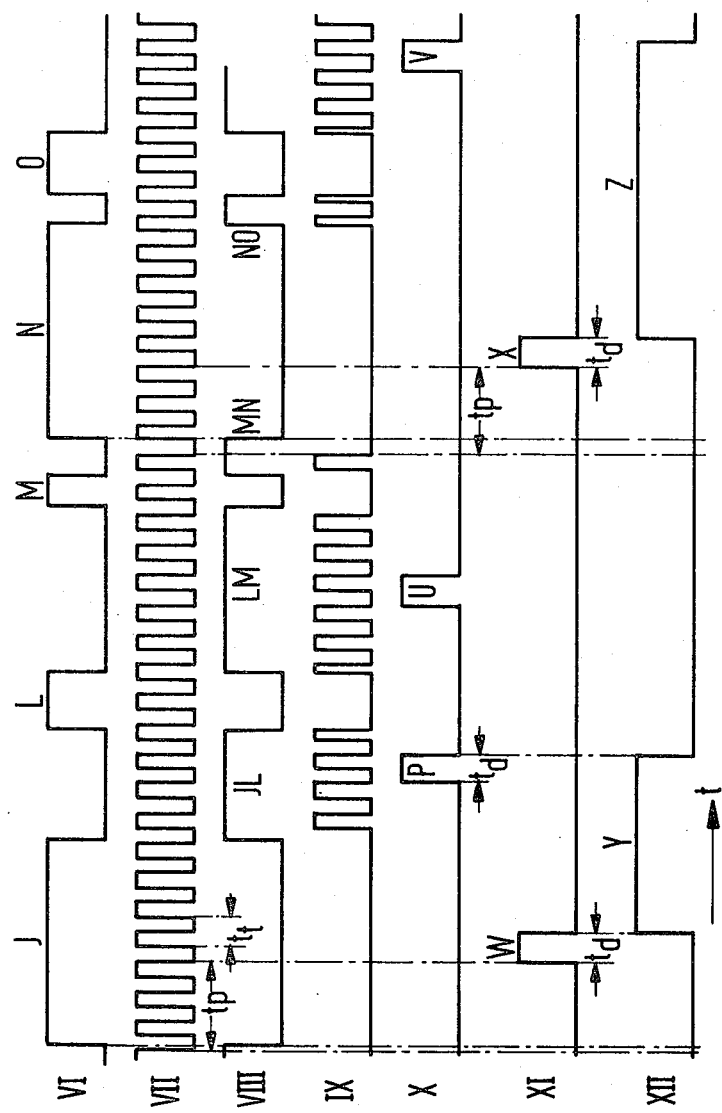
FIG. 4 illustrates series of pulses over the time t which occur in the circuit arrangement shown in FIG. 3.

The mode of operation of the circuit arrangement shown in FIG. 3 will be described in with reference to FIG. 4, in which pulse series are plotted over the time t, as they occur in the circuit arrangement. At this point it should be mentioned that the second circuit arrangement has the same function as the corresponding circuit components (gate 1, counter 2, decoder 3) of the first circuit arrangement. As in the latter, the test period is determined in the counter. The inputs 89 to 311 on the counter 32 here to indicate the possibility of setting a variable initial value. The pulse series VI with the pulses J to O is fed as an arbitrarily selected example to the input 5 of the gate 1. Counter pulses (pulse series VII in FIG. 4) are fed to the inputs 6 and 36 of the gates. For the sake of simplicity, the same counter pulses are fed to both inputs. The inputs 6 and 36 can in this case be connected to form one input. The inverter 30 inverts the input signal so that the pulse series VIII with the pulses JL, LM to MN, NO is present at the input 35 of the gate 31. The gate 31 is opened again for the counter pulses when a pulse is present at the input 35. This means that the gate 31 is opened whenever a pulse gap occurs at the input 5 of the gate 1. The pulse series IX composed of individual counter pulse groups arises at the output 37 of the gate 31. The gate is assumed to be an AND gate. A pulse is emitted at the output 318 of the decoder 33 only if the pulse at the input 35 or the pulse gap at the input 5 is longer than the test period $t_p$. The pulses P to V of the pulse series X represent the signal at the output of the decoder 33. The pulses W to X of the pulse series XI represent the signal at the output 18 of the decoder 3 of the circuit arrangement. The pulse W of the pulse series X sets the output Q of the binary storage element 4 via the input 19. The storage circuit remains set until a resetting pulse appears at the input 20 and resets the storage element. In the example, this is the pulse P of the pulse series X. The storage element is not set again until the next pulse (pulse X of the pulse series XI) appears at the input 19. The pulse series XII composed of the pulses Y to Z is emitted at the output Q of the storage element 4. In the example $t_p = 3 \cdot t_t$ was selected where $t_t$ is again the pulse train length of the counter pulse trains. In addition, the test period for the pulses and pulse gaps was assumed to be equal. In application, this will generally be satisfactory, but the circuit arrangement also permits the more general situation in which the test period is selected to be different for the pulse lengths than for the pulse gaps. The statements made in the following also apply unrestrictedly for this general situation.

The circuit arrangement combines input pulses (pulse J, and pulses N to O) in groups at the output Q to form one pulse (pulse Y, and pulse Z), if at least the pulse duration of the first pulse (pulse J, and pulse N) is greater than the test period $t_p$ and the following pulses are separated by pulse gaps whose duration is shorter than the test period (gating out of pulse gaps). The pulse duration of the following pulses is of no importance. Otherwise, all the input pulses (pulses L to M) are gated out in groups when the pulse duration is shorter than the test period (gating out of pulses). The first pulse of such a pulse group is separated from the last pulse of the previously described pulse group by a pulse gap (gap between J and L), the duration of which is longer than the test period. The duration of the pulse gaps of all the following pulses of this pulse group is of no importance. The resultant pulses and pulses gaps at the output Q have the length of the corresponding pulse groups up to an accuracy of $2 \cdot t_t$ and are displaced by the time $t_t + t_d$. The statements made above in the descriptions of FIG. 1 and FIG. 2 apply to $t_d$. The binary storage element 4 is preferably in the form of a RS flip-flop, where the output 18 of the decoder 3 is connected to the S input and the output 318 of the decoder 33 is connected to the R-input of this flip-flop.

In addition to the signal at the output Q of the storage element the circuit arrangement at the same time also supplies the inverted signal at the output $\overline{Q}$.

The circuit arrangement shown in FIG. 3 may be extended in such a manner that in accordance with FIG. 1, the output 18 of the decoder 3 is connected to a first input of a second binary storage element and the input 5 of the gate 1 is connected to a second input of this storage element. This similarly applies to the second circuit arrangement in FIG. 3 if the output 318 of the decoder 33 is connected to the first input and the input 35 of the gate 31 is connected to a second input of the third storage element. A signal is then available at the output of the second storage element out of which all those pulses of the input signal at the input 5 whose duration is shorter than the test period are gated out. Also available at the output of the third storage element is a signal from which all the pulse gaps of the input signal whose duration is less than the pulse period have been gated out. At the same time in both cases the inverted signals are available.

The above described circuit arrangements can be used for gating out interference signals of shorter duration than the useful signal. For example, in electronic control circuits for internal combustion engines, interference pulses generated by the ignition system of the motor are coupled onto longer signals lines. These interference pulses are of shorter duration than the pulses of the useful signals. The circuit arrangements are not, however, restricted to this case. They may be used in all situations in which the duration of the interference pulses is clearly below that of the useful signals.

It will be apparent to those skilled in the art that many modifications and variations may be effected without departing from the spirit and scope of the novel concepts of the present invention.

I claim as my invention:

1. A circuit arrangement for gating out pulses or pulse gaps whose duration is shorter than a given test period $t_p$ from a sequence of digital pulses applied at the input end with at least one first gate having at least two inputs, with at least one counter which may be set at a fixed initial value or at variable initial values, which receives a setting input for the setting of the counter to an initial value, and a counter input, with at least one decoding device which decodes the counted values in the counter, and which produces an output on which a pulse appears only if there is a specifiable but fixed counted value, and with at least one binary storage element having at least two inputs, whereby the output of the gate is connected to a counter input of said counter, and said output of the decoding device is connected to an input of the binary storage element, and whereby a first input of the first gate is connected to the setting input of the first counter, and to the second input of the binary storage element, and wherein the first gate receives a third input which is connected to the $\overline{Q}$ output of the binary storage element.

2. A circuit arrangement according to claim 1, wherein an inverter is connected in front of said first gate and the output of the inverter connected to the first input of said first gate.

3. A circuit arrangement according to claim 1 wherein said counter is a counter which may be set to variable initial values and whereby multiple inputs are provided for parallel input of variable initial values in the form of digital words.

4. A circuit arrangement as specified in claim 1 wherein the binary storage element is a clock-pulsed JK-flip-flop with a reset input, whereby said output of the decoding device is connected to the pulse input of the JK-flip-flop, and the first input of said first gate is connected to the reset input of the JK-flip-flop.

5. A circuit arrangement as specified in claim 1 wherein the binary storage element is an RS-flip-flop with a statically operating R- and S- input, whereby said output of the decoding device is connected to the R- input, and the first input of said first gate is connected to the S- input.

6. A circuit arrangement as specified in claim 1 wherein the decoding device consists of a zero transition switching mechanism for negative carry, and of an inverter connected to the output side of the zero transition switching mechanism and whereby the inverter output forms said output of the decoding device.

7. A circuit arrangement for gating out pulses and pulse gaps whose duration is shorter than a give test period $t_p$ from a sequence of digital pulses applied at the input end, with at least first and second gates whereby each gate receives at least two inputs, with at least first and second counters which may be set to fixed initial value or to variable initial values, respectively, whereby each counter receives a setting input for the purpose of setting the counter to an initial value, and a counter input, with at least a first decoding device, which decodes the counted values in the first counter, and which receives an output in which an impulse appears only if there is a specifiable but fixed counted value, and with a second decoding device which decodes the counted values in the second counter, and which receives an output in which a pulse appears only if there is a specifiable but fixed counted value, and with at least one binary storage element having at least two inputs, whereby the output of the first gate is connected to a counting input of the first counter and the output of the second gate is connected to a counting input of the second counter, said output of the first decoding device is connected to an input of the binary storage element, a first input of said first gate is connected to the setting input of the first counter, and to a first input of the second gate, an inverter connected between the first input of the first gate and the first input of the second gate, the first input of the second gate connected to the setting input of the second counter, and said output of the second decoding device connected to the second input of the binary storage element.

8. A circuit arrangement as specified in claim 7, wherein said first gate receives a third input which is connected to the $\overline{Q}$ output of the binary storage element.

9. A circuit arrangement as specified in claim 7 wherein multiple inputs are provided to the first counter and/or to the second counter for the input of digital words as initial values.

10. A circuit arrangement as specified in claim 7 wherein said binary storage element is an RS-flip-flop, and said output of the first decoding device is connected to the S-input, and said output of the second decoding device is connected to the R-input of the RS-flip-flop.

11. A circuit arrangement as specified in claim 7 wherein said first and second decoding device consist of a zero transition switching mechanism.

* * * * *